(12) United States Patent
Tsujikawa et al.

(10) Patent No.: US 6,897,104 B2
(45) Date of Patent: May 24, 2005

(54) SEMICONDUCTOR DEVICE AND METHOD FOR MANUFACTURING THEREOF

(75) Inventors: Shimpei Tsujikawa, Tokyo (JP); Toshiyuki Mine, Fussa (JP); Jiro Yugami, Yokohama (JP); Natsuki Yokoyama, Mitaka (JP); Tsuyoshi Yamauchi, Akishima (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/452,126

(22) Filed: Jun. 3, 2003

(65) Prior Publication Data

US 2003/0228725 A1 Dec. 11, 2003

(30) Foreign Application Priority Data

Jun. 7, 2002 (JP) .................................... 2002-166630

(51) Int. Cl.$^7$ .......................................... H01L 21/8238
(52) U.S. Cl. ........................ 438/216; 438/275; 438/591
(58) Field of Search ................................. 438/216, 275, 438/287, 591, 775, 794, 910

(56) References Cited

U.S. PATENT DOCUMENTS

| | | | | |
|---|---|---|---|---|
| 4,621,277 A | * | 11/1986 | Ito et al. ..................... | 257/313 |
| 5,254,489 A | * | 10/1993 | Nakata ........................ | 438/275 |
| 6,436,845 B1 | * | 8/2002 | Kamath et al. ............. | 438/769 |
| 6,461,919 B1 | * | 10/2002 | Shibata ....................... | 438/275 |

FOREIGN PATENT DOCUMENTS

JP  2001-7217  1/2001

OTHER PUBLICATIONS

Marie S.C. Luo et al., "A 0.25$\mu$m CMOS Technology with 45Å No–nitrided Oxide," *IEDM Technical Digest*, 1995, pp. 691–694.

M. Togo et al. "Low–Leakage and Highly–Reliable 1.5nm SiON Gate–Dielectric Using Radical Oxynitridation for Sub–0.1 $\mu$m CMOS," *2000 Symposium on VLSI Technology Digest of Technical Papers*, 2000, pp. 116–117.

\* cited by examiner

*Primary Examiner*—Chandra Chaudhari
(74) *Attorney, Agent, or Firm*—Miles & Stockbridge P.C.

(57) ABSTRACT

A semiconductor device and a method for manufacturing the same of forming a silicon nitride film selectively without giving damages or contaminations to a surface of the silicon substrate thereby forming different types of gate dielectrics in one identical silicon substrate, are obtained by forming a silicon dioxide on the surface of a silicon substrate, then removing a portion thereof, forming a silicon nitride film to the surface of the substrate from which the silicon dioxide has been removed and, simultaneously, introducing nitrogen to the surface of the silicon dioxide which is left not being removed or, alternatively, depositing a silicon dioxide on the surface of the silicon substrate by chemical vapor deposition, then removing a portion thereof, forming a silicon nitride film on the surface of a substrate from which the silicon dioxide has been removed, and, simultaneously, introducing nitrogen to the surface of the silicon dioxide left not being removed, successively, dissolving and removing nitrogen-introduced silicon oxide film to expose the surface of the substrate and oxidizing the exposed surface of the silicon substrate and the silicon nitride film.

5 Claims, 7 Drawing Sheets

SEMICONDUCTOR DEVICE AND METHOD FOR MANUFACTURING THEREOF

FIELD OF THE INVENTION

The present invention concerns a semiconductor device formed by integrating MOS (Metal Oxide Semiconductor) devices and, more in particular, it relates to a semiconductor device having gate dielectrics for a plurality of different types of MOS devices, as well as a method for manufacturing thereof.

BACKGROUND OF THE INVENTION

In semiconductor devices comprising MOS devices such as MOS transistors as basic constituent elements, those in which MOS devices of different required performances such as memory cells and peripheral circuits, digital circuits and analog circuits, and devices requiring high speed operation and devices requiring low power consumption operation are present together have been used more and more. For satisfying respective required performances for different MOS devices, it is effective to form plural types of MOS devices having gate dielectrics different from each other. The technique for attaining the same includes, for example, a multi-level gate dielectric technique. Semiconductor devices having plural MOS devices formed by disposing silicon dioxides of multi-level thickness together have been generally mass produced.

Now, description is to be made to an example of the prior art of forming two types of gate dielectrics comprising two levels of thickness with reference to FIGS. 8A to 8G. After forming an isolation trench 2 by using well-known shallow trench isolation on the surface of a silicon substrate 1, a silicon dioxide 3 of 7.7 nm thickness is formed on the silicon substrate 1 at 800° C. by pyrogenic oxidation while flowing oxygen at 10 liter/min and hydrogen at 0.5 liter/min simultaneously (FIG. 8A).

Then, a resist 4 is coated over the entire wafer surface (FIG. 8B), and usual pattering is conducted to remove a portion of the resist (FIG. 8C). The substrate 1 is divided at this step into a domain 1 for a portion covered with the resist 4 and a domain 2 for a portion not covered with the resist 4.

Successively, the gate dielectric 3 in the domain 2 is removed by a diluted HF solution (FIG. 8D) and then the resist 4 is dissolved and removed by an aqueous solution containing $H_2SO_4$ and $H_2O_2$ (FIG. 5E). Subsequently, cleaning with an aqueous solution containing $NH_3$ and $H_2O_2$ (hereinafter referred to as "SC-1 cleaning") and cleaning with an aqueous solution containing HCl and $H_2O_2$ (hereinafter referred to as "SC-2 cleaning") are conducted to remove contaminations on the surface. Further, after conducting the SC-1 cleaning and cleaning with the diluted HF solution, pyrogenic oxidation is conducted at 800° C. to form a gate dielectric 5 which is a silicon dioxide of 4 nm thickness and a gate dielectric 6 which is a silicon oxide of 8 nm thickness.

By the way, decrease of the thickness of the gate dielectric has been progressed rapidly in recent years in view of the demand for higher speed operation or lower voltage operation of MOS devices. As a result, a problem of increasing current that leaks through the dielectric film, that is, agate leak current and a problem of diffusion of boron (B) in the gate electrode through the gate dielectric to a silicon substrate have become conspicuous. In a case of forming multi-level thickness gate dielectrics, the problems are conspicuous naturally in the gate dielectric of least thickness.

A countermeasure for preventing increase of the gate leak current or B diffusion includes a method of introducing nitrogen by heat treating a silicon dioxide in a nitrous oxide ($N_2O$) gas or nitric oxide (NO) gas atmosphere disclosed, for example, in a first document: US document: "IEDM Technical Digest", page 691 (issued in 1995) and this has already been adopted in mass production.

Further, as the thickness of the gate dielectric is decreased to 2 nm or less as the equivalent oxide thickness converted from the electric capacitance, the problem of gate leak current or B diffusion becomes more stringent. In this case, it is demanded for a gate dielectric comprising an Si—O—N ternary system material having higher nitrogen concentration, and a method of treating the silicon dioxide by using an active nitrogen is disclosed, for example, in a second document: US and Japanese documents "Symposium on VLSI Technology Digest of Technical Papers", page 116 (issued in 2000). By the method described above, greater amount of nitrogen is introduced into the silicon dioxide compared with the method of using a heat treatment in the $N_2O$ gas or NO gas atmosphere.

On the other hand, for decreasing the thickness of the gate dielectric, with a view point of preventing degradation in the uniformity of thickness of the silicon dioxide and heavy metal contamination caused by the resist of the silicon dioxide, apart from the view point of suppressing the gate leak current or B diffusion by the decrease of the thickness for the gate dielectric, a method of forming a gate dielectric comprising silicon nitride as a base structure is disclosed, for example, in a third document: Japanese Patent Laid-Open No. 2001-7217.

According to the third document, the gate dielectric with silicon nitride is formed as described below. As shown in FIGS. 9A to 9C, a well layer 94 is formed on a silicon substrate 91 and, after further forming a device isolation dielectric layer 92 selectively, a silicon nitride film 95 is formed over the entire region with no device isolation dielectric layer 92 (FIG. 9A), and a nitride film 95 is removed selectively using a resist as a mask (FIG. 9B). Then, a heat treatment is conducted in an oxidative atmosphere, a silicon dioxide is formed to a region removed with the silicon nitride film 95 and, at the same time, a film formed by thermally oxidizing the silicon nitride film is formed in a region where the silicon nitride film 95 is left and they are used, respectively, as gate dielectrics 98 and 97 (FIG. 9C).

SUMMARY OF THE INVENTION

For further suppressing the gate leak current and B diffusion than in the case described above of introducing nitrogen into the silicon dioxide, it is necessary to use a gate dielectric comprising silicon nitride as a basic structure.

The third document discloses an example of decreasing the film thickness by using the silicon nitride film with a different point of view. However, it is difficult to effectively suppress damages and contaminations given to the surface of the silicon substrate by the existent method of removing the silicon nitride film by plasma etching using a resist as a mask thereby selectively forming the silicon nitride film, for forming different types of gate dielectrics.

By the way, positive fixed charges are inevitably generated in the silicon nitride film. No sufficient driving current can be obtained in MOS transistors if such positive fixed charges are present. The problem has not yet been solved so far, and a technique of forming a multi-level thickness gate dielectrics by using gate dielectrics based on silicon nitride has not yet been established at present.

This invention mainly intends to provide a semiconductor device of forming different types of gate dielectrics within an identical silicon substrate by selectively forming silicon nitride films without giving damages and contaminations to the surface of a silicon substrate, as well as a method for manufacturing thereof.

The present invention further intends to provide a semiconductor device of improving the current drivability of MOS devices by decreasing positive fixed charges in silicon nitride films, as well as a manufacturing method thereof.

The main purpose described above can be attained effectively by forming a silicon dioxide on the surface of a silicon substrate, then removing a portion thereof and forming a silicon nitride film on the surface of the substrate from which the silicon dioxide has been removed.

Since the region for forming the silicon nitride film is formed by removing the silicon dioxide, different type of gate dielectrics comprising a silicon nitride film and a nitrogen-containing silicon oxide film can be formed while preventing damages and contaminations to the surface of the silicon substrate.

The present inventors have found that oxygen introduced into the silicon nitride film decreases the positive fixed charges generated in the silicon nitride film thereby increasing the driving current of the MOS device. The invention has been achieved based on such finding. That is, the additional purpose can be attained effectively by introducing oxygen into the silicon nitride film by a heat treatment in an oxidative atmosphere The silicon nitride film to which oxygen was incorporated, that is, an oxygen-containing silicon nitride film desirably has a film thickness of 1.5 nm or less before introduction of oxygen.

Further, the main purpose described above can be attained effectively by depositing a silicon dioxide on the surface of a silicon substrate by a chemical vapor deposition method, removing a portion thereof, forming a silicon nitride film on the surface of the substrate from which the silicon dioxide has been removed, successively, melting and removing the silicon dioxide formed by the chemical vapor deposition method thereby exposing the surface of the substrate, and oxidizing the exposed surface of the silicon substrate and the silicon nitride film to form a silicon dioxide not substantially containing nitrogen and a silicon nitride film containing oxygen.

Since the region for forming the silicon nitride film is formed by removing the silicon dioxide and, further, the region for forming the silicon dioxide not substantially containing nitrogen is formed by dissolving and removing the silicon dioxide to which nitrogen was incorporated, different types of gate dielectrics comprising the oxygen-containing silicon nitride film and the silicon dioxide not substantially containing nitrogen can be formed while preventing damages and contaminations to the surface of the silicon substrate.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1A:
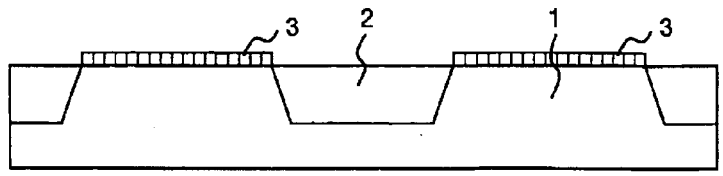
FIGS. 1A to 1F are cross sectional views for explaining a first embodiment of a method of manufacturing a semiconductor device according to the present invention.
Figure 1B:
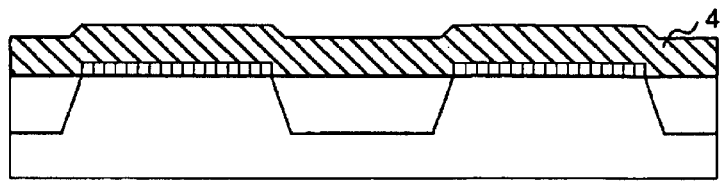

A semiconductor device and a manufacturing method thereof according to the present invention are to be described more specifically with reference to several embodiments of the present invention shown in the drawings.

<Embodiment 1>

A method of manufacturing a semiconductor device of two-level thickness having a gate dielectric formed of oxygen-containing silicon nitride and a gate dielectric formed of nitrogen-containing silicon oxide are to be described with reference to FIGS. 1A to 1F and FIG. 3.

After forming an isolation trench 2 by using well-known shallow trench isolation to the surface of a p-silicon substrate 1, B (boron) ions are ion implanted in a state of covering a desired region with a resist by using photolithography to form p-well (not illustrated) in a portion of a region of the silicon substrate.

Figure 1C:
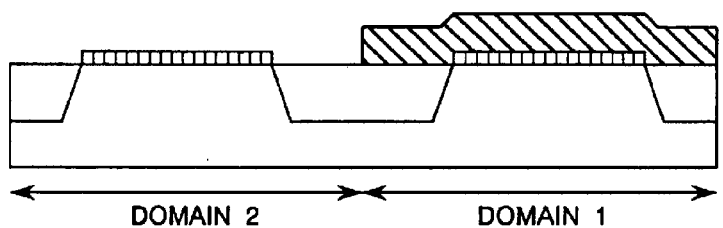
Figure 1D:
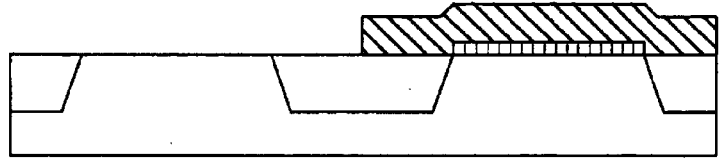

Successively, a silicon dioxide 3 of 3 nm thickness is formed on the silicon substrate 1 by dry oxidation at 800° C. (FIG. 1A). Then, a resist 4 is coated over the entire surface of a wafer (FIG. 1B), and a portion of the resist is removed by conducting usual patterning (FIG. 1C). At this step, the substrate 1 is divided into a domain 1 for a portion covered with the resist 4 and a domain 2 at a portion not covered with the resist 4.

Figure 1E:
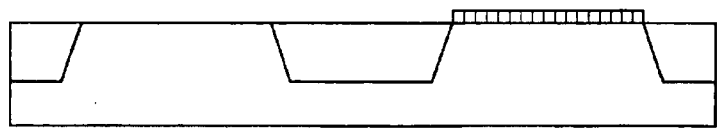

Successively, the silicon dioxide 3 in the domain 2 is removed with a diluted HF solution (FIG. 1D) and then the resist 4 is dissolved and removed by an aqueous solution containing $H_2SO_4$ and $H_2O_2$ (FIG. 1E). Then, SC-1 cleaning and SC-2 cleaning are conducted to remove contaminations on the surface. Further, for removing a thin silicon dioxide formed on the domain 2 by the cleaning treatment described above, SC-1 cleaning and cleaning with diluted HF are conducted. Then, the thickness of the silicon dioxide 3 on the domain 1 is decreased to 2 nm.

Figure 1F:
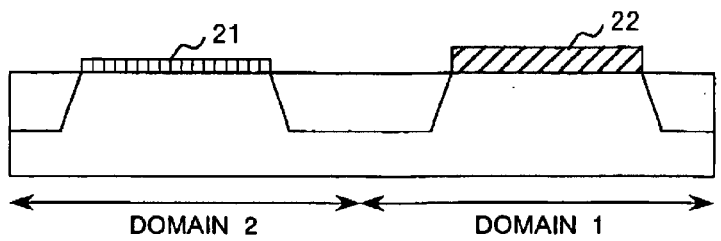

Successively, a silicon nitride film of 0.9 nm thickness is formed on the surface of the silicon substrate 1 in the domain 2 by a heat treatment at 700° C. in an $NH_3$ atmosphere and, successively, oxygen is introduced into the silicon nitride film by a heat treatment at 900° C. in an nitrous oxide $N_2O$ atmosphere to form an oxygen-containing silicon nitride film 21 in the domain 2. In this process, the thickness of the silicon dioxide 3 in the domain 1 is somewhat increased along with introduction of nitrogen by the heat treatment in the $NH_3$ atmosphere and the heat treatment in the $N_2O$ atmosphere, to form a nitrogen-containing silicon oxide film 22 of 2.5 nm thickness (FIG. 1F).

Figure 2:
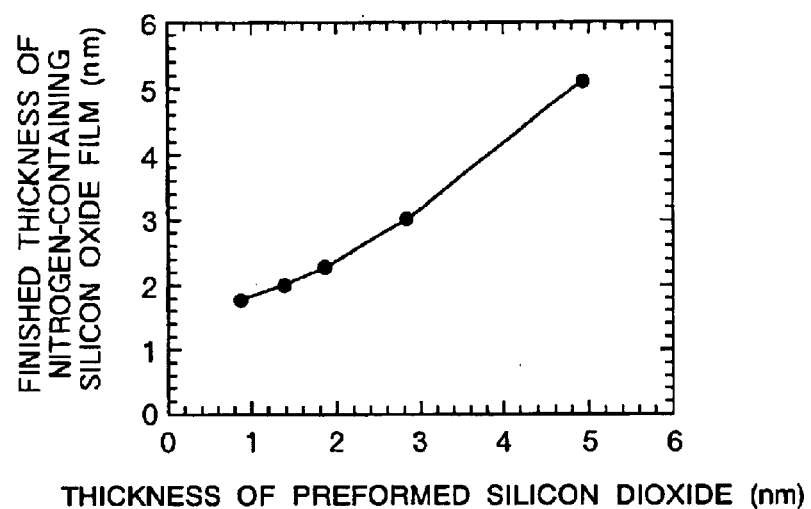
FIG. 2 is a graph showing a finished film thickness in a case of incorporating nitrogen to a previously formed silicon dioxide.

The thickness of the nitrogen-containing silicon oxide film 22 can be controlled by changing the thickness of the silicon dioxide 3 present in the domain 1 at the stage preceding to the heat treatment in the $NH_3$ atmosphere and heat treatment in the $N_2O$ atmosphere, in which the relation between the thickness of the silicon dioxide 3 at the stage before the heat treatment in the $NH_3$ atmosphere and the heat treatment in the $N_2O$ atmosphere and the thickness of nitrogen-containing silicon oxide film 22 completed in the domain 1 is as shown in FIG. 2.

Different types of gate dielectrics with the nitrogen-containing silicon oxide film 22 and the oxygen-containing silicon nitride film 21 are formed in the domain 1 and the domain 2, respectively. Successively, n-channel MOS transistors are prepared in both of the regions. Since the basic manufacturing method is in common with both of the regions, the method of manufacturing the MOS transistor in the domain 2 is explained typically with reference to FIG. 3.

A polycrystal silicon film of 200 nm thickness is deposited on a gate dielectric with the oxygen-containing silicon nitride film 21 by a well-known chemical vapor deposition process using monosilane as a source gas and P (phosphorus) at $4 \times 10^{15}/cm^2$ is ion implanted at an acceleration voltage of 10 kV and this is fabricated into a desired size by using photo-lithography and dry etching to form a gate electrode 14. Then, As (arsenic) at $3 \times 10^{14}/cm^2$ is ion implanted at an acceleration voltage of 15 kV to form a low concentration region of a diffusion layer 15.

Then, a silicon dioxide is formed to 100 nm thickness by using mono-silane and $N_2O$ by a chemical vapor deposition process and, successively, it is etched by anisotropic dry-etching to form sidewalls 16 formed of silicon oxide. P at $2 \times 10^{15}/cm^2$ is ion implanted at an acceleration voltage of 30 kV to form a high concentration region of the diffusion layer 15. Then, heat treatment is conducted at 950° C. for 30 sec to electrically activate As and P which have been ion implanted into the diffusion layer 15.

After the heat treatment as described above, a silicon dioxide is deposited to 600 nm thickness by using tetra-ethoxysilane $(Si(OC_2H_5)_4)$ by plasma-enhanced chemical vapor deposition (PECVD) which is planarized by chemical mechanical polishing to form an inter-layer insulator 17. Contact holes are opened to the inter-layer insulator 17 by using photo-lithography and dry etching, and tungsten is deposited as far as the inside of the contact hole by using chemical vapor deposition and sputtering, which are then fabricated by photo-lithography and dry etching into wirings 18.

Figure 3:
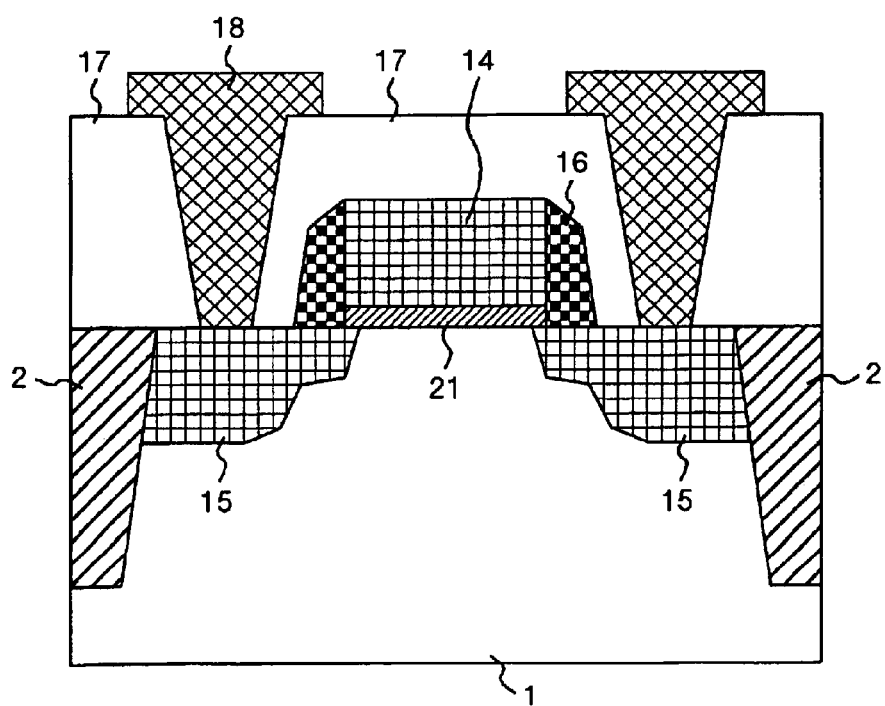
FIG. 3 is a cross sectional view for explaining a semiconductor device manufactured according to a first embodiment of the invention.

By way of the steps described above, an n-channel MOS transistor having the structure shown in FIG. 3 is prepared in the domain 2. An n-channel MOS transistor is prepared also in the domain 1 by the same method.

In this embodiment, ion implantation of groups III element (B) for the well and of group V element (As) and (P) for the gate electrode 14 and diffusion layer 15 are conducted. However, a p-channel MOS transistor can also be prepared by conducting ion implantation of the group V element to the well and the group III element to the gate electrode 14 and diffusion layer 15 by reversing the type of impurities to be ion implanted, so that the n-channel MOS transistor and the p-channel MOS transistor can be formed on one identical substrate to constitute a CMOS device.

While the step of forming the oxygen-containing silicon nitride film 21 has been described as applying the heat treatment in the $N_2O$ atmosphere after thermal nitridation using $NH_3$, nitridation using nitrogen radicals instead of the thermal nitridation using ammonia may be applied to obtain an identical result. In a case of forming a thin silicon nitride film of 1 nm or less, the latter method is excellent over the thermal nitridation using $NH_3$, from the view point of micro-scopic uniformity of the thickness although the controllability for the film thickness is inferior.

The purpose of the heat treatment in the $N_2O$ atmosphere is to decrease positive fixed charges present usually in the silicon nitride film and decreasing charge trapping states present at the interface between the silicon nitride film and the silicon substrate by introducing oxygen into the film. The positive fixed charges or charge trapping states decreases the driving current for MOS transistor.

Instead of the heat treatment in the $N_2O$-containing atmosphere, a heat treatment in a dry oxygen atmosphere (hereinafter referred to as dry oxidation) or a heat treatment in an atmosphere containing steams and oxygen (hereinafter referred to as wet oxidation) may be conducted, but this heat treatment is sometimes inferior in the controllability for the equivalent oxide thickness and the effect of suppressing the gate leak current.

Conditions for the formation of silicon nitride and conditions for the heat treatment in the atmosphere containing $N_2O$ atmosphere during the step of forming the gate dielectric with the silicon nitride film 21 are decided while considering the aimed value for the final equivalent oxide thickness. For different silicon nitride forming conditions, the optimum conditions of introducing oxygen are different.

The charge trapping states and the fixed charges in the film can not be decreased as the thickness of the silicon nitride film formed at first increases unless the conditions for the heat treatment in the $N_2O$ atmosphere are set to higher temperature or longer time. When the thickness of the silicon nitride film formed at first exceeds 1.5 nm, shift of the flat band voltage in the negative direction with reference to the thermal oxide film exceeds 0.2 V even if the heat treatment in the $N_2O$ atmosphere is conducted at higher temperature and for longer time. That is, control for the threshold voltage becomes difficult and scattering of charges in the channel due to the positive fixed charges in the film is no more negligible to lower the current drivability of the transistor.

For example, in a case where a heat treatment in the $N_2O$ atmosphere is conducted after forming silicon nitride of 1.5 nm thickness thereby forming an oxygen-containing silicon nitride gate dielectric, the conditions of the heat treatment in the $N_2O$ atmosphere that provide preferred electrical characteristics are, for example, at 950° C. for 10 min. Also in this case, shift of the flat band voltage to the negative direction with reference to the thermal oxide film was 0.25 V and equivalent oxide thickness was 2.5 nm.

Further, compared with a thermal oxide film of 2.5 nm thickness, the current drivability in a case of use for the gate dielectric of an n-MOS transistor was about 85%. In a case of increasing the thickness of the previously formed silicon nitride film to 1.5 nm or more, lowering of the current drivability is more conspicuous. That is, use of the oxygen introduced silicon nitride film for the gate dielectric is practical when the thickness of the silicon nitride film formed at first is 1.5 nm or less and the equivalent oxide thickness in a completed state is 2.5 nm or less.

Figure 4:
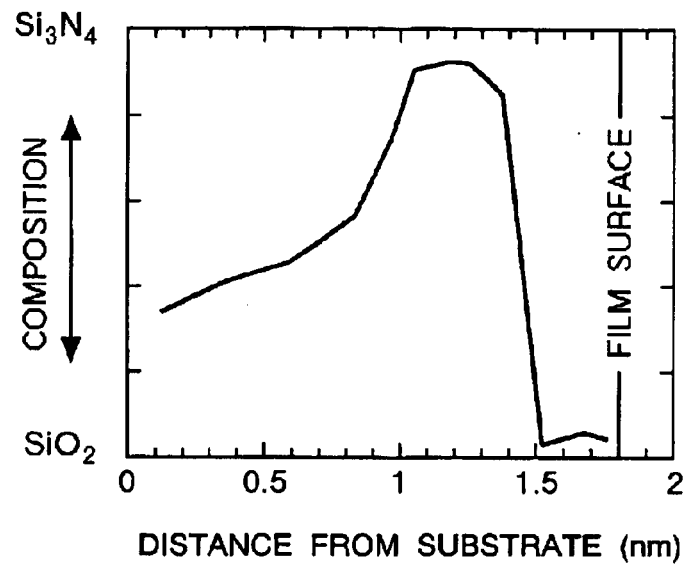
FIG. 4 is a graph showing a distribution, along the direction of the thickness, of a composition of an oxygen-containing silicon nitride film manufactured according to a first embodiment of the invention.

For examining the state of introducing oxygen into the silicon nitride film, when a specimen was prepared by forming a silicon nitride film of 1.3 nm thickness on a silicon substrate with no pattern, and then applying a heat treatment at 800° C. for 10 min in an $N_2O$ atmosphere diluted to 5% by nitrogen, and wet etching using a diluted HF solution and measurement by X-ray photo-electron spectroscopy were repeated, a profile for the composition in the direction of the thickness was obtained as shown in FIG. 4. It has been found that a portion of a composition approximate to silicon dioxide of 0.5 nm thickness or less was formed on the surface of silicon nitride and, at the same time, oxygen was introduced to the boundary between the silicon nitride and the silicon substrate. That is, the oxygen concentration in the film shows an extreme maximum value at the surface of silicon nitride and at the boundary between silicon nitride and the silicon substrate. That is, the oxygen concentration in the film shows a minimum value in the intermediate portion of the film between the surface of silicon nitride and boundary between silicon nitride and the silicon substrate.

The structure of the silicon nitride film described above is also in common with Embodiments 2 and 3 of the invention to be described later.

The compositional distribution of the dielectric film comprising oxygen and nitrogen as main constituent elements prepared in the prior art is to be mentioned. At first, in a case of introducing nitrogen to a silicon dioxide by using $N_2O$ or NO (the first document described above), nitrogen is introduced selectively to the boundary between the silicon oxide and the silicon substrate. That is, the nitrogen concentration is maximum (also extremely maximum) at the boundary between silicon oxide and the silicon substrate. Then, in a case of introducing nitrogen into the silicon dioxide by using silicon radicals (the second document described above), nitrogen is introduced to the surface of silicon oxide, that is, the nitrogen concentration is maximum (also extreme maximum) near the surface of silicon oxide. Accordingly, this is apparently different from the silicon nitride film containing oxygen as the feature of the invention in view of the compositional distribution. That is, the distribution of the composition in the direction of the thickness differs greatly between a film formed by introducing oxygen after forming a silicon nitride film and a film formed by introducing nitrogen after forming a silicon dioxide. Accordingly, the oxygen-containing silicon nitride film is distinguished clearly from the nitrogen-containing silicon oxide film in the present specification.

Now, the n-channel MOS transistor has been prepared in the domain 2 as described above, the same method of preparing the transistor is applied also to the domain 1 to prepare n-channel MOS transistors having two types of different gate dielectrics on one identical silicon substrate.

The equivalent oxide thickness of the gate dielectric determined from the measurement for the electric capacitance is 2.5 nm for domain 1 and 1.6 nm for domain 2. In addition, the gate leak current of the MOS transistor in the domain 2 was suppressed to $\frac{1}{40}$ compared with that of the MOS transistor using a silicon dioxide of 1.6 nm thickness as the gate dielectric. In the n-MOS transistor with a gate length of 1 μm prepared in the domain 2, the value for the drain current measured under the bias condition for both of the gate voltage and the drain voltage of 1 V was satisfactory as 97% compared with the MOS transistor using a silicon dioxide of 1.6 nm thickness as the gate dielectric.

Further, a p-channel MOS transistor was prepared by using the method of preparing the p-channel MOS transistor described above and diffusion of boron from the gate electrode comprising B-doped polycrystals to the silicon substrate was examined. It has been found that the oxygen-containing silicon nitride film 21 prepared in the domain 2, B leaked to the substrate was suppressed to $\frac{1}{100}$ or less compared with a silicon dioxide of 1.6 nm thickness. A great amount of nitrogen contained in the film inhibits B diffusion.

As described above, it is possible to form two types of gate dielectrics of an oxygen-containing silicon nitride film 21 with an equivalent oxide thickness of 1.6 nm, a gate leak current restricted to $\frac{1}{40}$ of a silicon dioxide, and having good current drivability and extremely effective suppression for B diffusion and a nitrogen-containing silicon oxide film 22 of an equivalent oxide thickness of 2.5 nm on the surface of a silicon substrate on one identical wafer without giving damages or contaminations to the surface of the silicon substrate. Further, the thickness of the nitrogen-containing silicon oxide film 22 can be controlled by changing the thickness of the silicon dioxide 3 formed in the domain 1.

Figure 5:
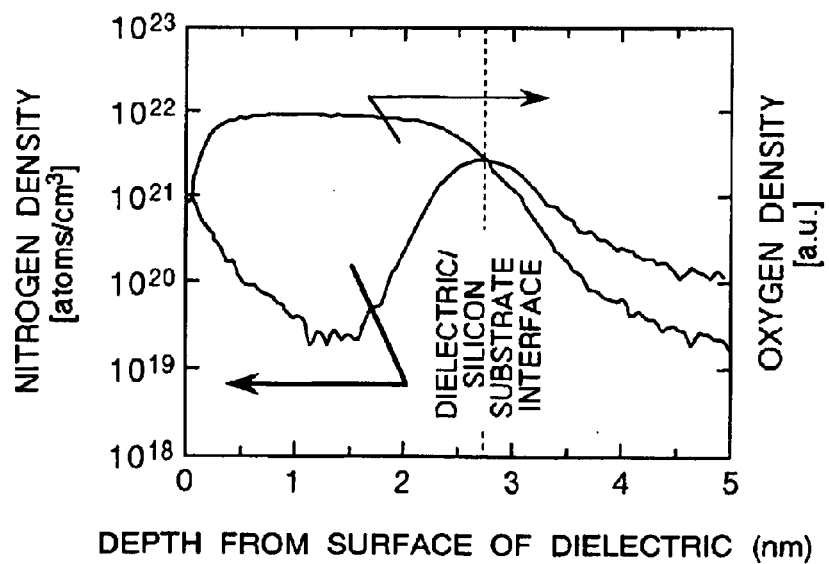
FIG. 5 is a graph showing a distribution, along the direction of the thickness, of a composition of a nitrogen-containing silicon oxide film manufactured according to a first embodiment of the invention.

The composition for the nitrogen-containing silicon oxide film 22 formed in the domain 1 is to be described. When silicon, oxygen and nitrogen of the nitrogen-containing silicon oxide film 22 was analyzed by secondary ion mass spectroscopy, it was as shown in FIG. 5. It can be seen that nitrogen is introduced to the boundary between the silicon dioxide and the silicon substrate like the case of introducing nitrogen into the silicon dioxide by a heat treatment in the $N_2O$ or NO atmosphere. That is, the nitrogen concentration is maximum (also extreme maximum) at the boundary between the silicon dioxide and the silicon substrate.

Further, the embodiment of the invention described above can be extended so as to form three or more types of gate dielectrics on one identical substrate by the combination with an existent method of forming silicon dioxides having plural types of film thickness level on one identical silicon substrate. For example, an oxygen-containing silicon nitride film and plural nitrogen-containing silicon oxide films can be formed on one identical silicon substrate by forming silicon dioxides having plural film thickness levels on one identical silicon substrate, then selectively removing a portion thereof and applying a heat treatment in an ammonia atmosphere and a heat treatment in an $N_2O$ atmosphere.

<Embodiment 2>

A method of manufacturing a two thickness level semiconductor device having a gate dielectric formed of oxygen-containing silicon nitride and a gate dielectric formed of not substantially nitrogen-containing silicon oxide is to be described with reference to FIGS. 6A to 6F.

Figure 6A:
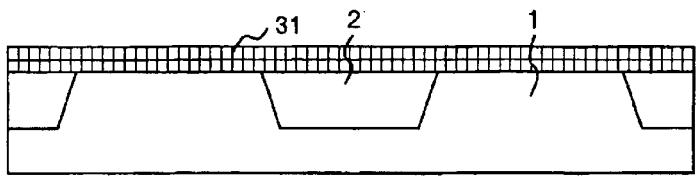
FIGS. 6A to 6F are cross sectional views for explaining a second embodiment of the invention.

After forming isolation trenches 2 by using well-known shallow trench isolation on the surface of the silicon substrate 1, a silicon dioxide 31 of 10 nm thickness is deposited by chemical vapor deposition using monosilane and $N_2O$ as a source gas (FIG. 6A)

Figure 6B:
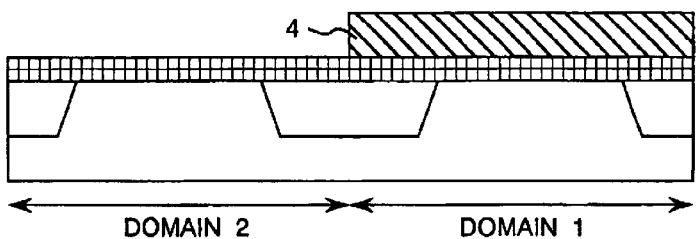

Then, a resist 4 is coated on the entire surface of a wafer and usual patterning is applied to remove a portion of the resist (FIG. 6B). In this step, the substrate 1 is divided into a domain 1 as a portion coated with a resist 4 and the domain 2 as a portion not coated with the resist 4.

Figure 6C:
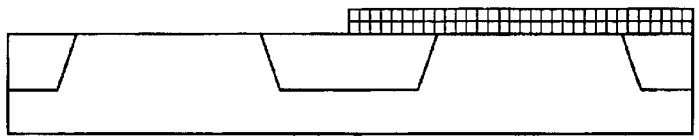

Successively, the silicon dioxide 31 in the domain 2 is removed by a diluted HF solution and then the resist 4 is dissolved and removed by an aqueous solution containing $H_2SO_4$ and $H_2O_2$ (FIG. 6C). Then, SC-1 cleaning and SC-2 cleaning are conducted to remove contaminations on the surface. Further, SC-1 cleaning and cleaning with a diluted HF solution are conducted to expose the surface of the silicon substrate in the domain 2. The silicon dioxide 31 on the domain 1 is decreased from 10 nm to 5 nm by the cleaning with the diluted HF solution.

Figure 6D:
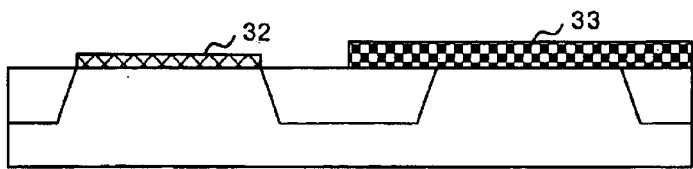

Then, a silicon nitride film of 0.9 nm thickness is formed on the surface of the silicon substrate in the domain 2 by a heat treatment at 700° C. in an $NH_3$ atmosphere and successively oxygen is introduced to the silicon nitride film by a heat treatment at 900° C. in an $N_2O$ atmosphere diluted to 5% with nitrogen to form an oxygen-containing silicon nitride film 32. In this process, the thickness of the silicon dioxide 3 on the domain 1 increases to 5.8 nm and, simultaneously, nitrogen is introduced to form a nitrogen-containing silicon oxide film 33 (FIG. 6D).

Successively, the nitrogen-containing silicon oxide film 33 on the domain 1 is dissolved and removed with a diluted HF solution. The nitrogen-containing silicon oxide film 33 is a silicon dioxide formed originally by chemical vapor deposition although applied with the heat treatment in the $NH_3$ gas atmosphere and the $N_2O$ atmosphere and, accordingly, shows a higher dissolution rate with the diluted HF solution than the so-called thermal oxide film of silicon formed by usual thermal oxidation. Accordingly, the nitrogen-containing silicon oxide film 33 is removed completely by the treatment of dissolving the thermal oxide film by 4 nm.

On the other hand, while the oxygen-containing silicon nitride film 32 formed in the domain 2 is rapidly dissolved by the diluted HF solution for the portion of the composition near silicon oxide formed in the upper portion, the lower portion having the composition near the silicon nitride in the portion therebelow shows a low etching rate with the diluted HF solution and is scarcely dissolved even when etching of dissolving the thermal oxide film by 4 nm is applied. Thus, by the dissolving treatment with the diluted HF solution, the silicon substrate is exposed in the domain 1 and only the portion having the composition near the silicon oxide in the upper portion of the oxygen-containing silicon nitride film 32 is removed in the domain 2 (FIG. 6E).

Successively, a silicon dioxide 34 is formed on the silicon substrate in the domain 1 by a heat treatment in an atmosphere containing dry oxygen, that is, dry oxidation. In the process, oxygen is further introduced to the oxygen-containing silicon nitride film 32 in the domain 2 and a portion having a composition near silicon oxide is formed again to the upper portion (FIG. 6F).

Figure 6E:
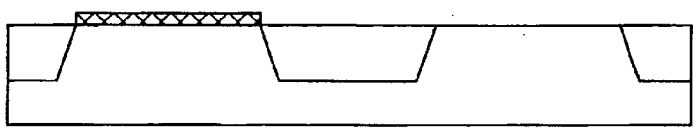
Figure 6F:
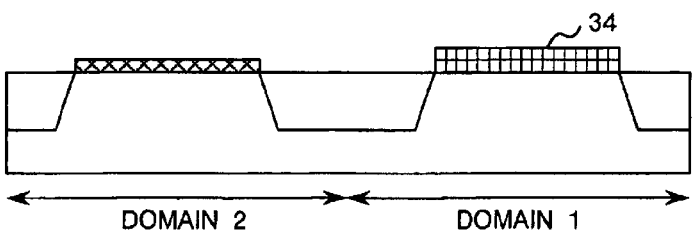

The deposition of the silicon dioxide 31 formed by chemical vapor deposition is conducted for the preparation of providing a structure in which oxygen-containing silicon nitride is present only in the domain 2 as shown in FIG. 6E. The silicon dioxide 31 may be dissolved rapidly with the diluted HF solution after applying the heat treatment in the $NH_3$ atmosphere and the $N_2O$ atmosphere and it may be a silicon dioxide deposited by chemical vapor deposition using an organic material such as tetraethoxysilane.

As the means for obtaining the structure shown in FIG. 6E, it may also be considered a method of forming an oxygen-containing silicon nitride film simultaneously also in the domain 1 like in the domain 2 and removing the oxygen-containing silicon nitride film on the domain 1 in a state of protecting the domain 2 by patterning using a resist. However, the oxygen-containing silicon nitride film shows low dissolution rate to the diluted HF solution and it is difficult to be dissolved and removed by the diluted HF solution. While it can be dissolved rapidly to an aqueous phosphoric acid solution kept at high temperature of about 180° C., protection by a resist is difficult. As other means than dissolution and removal with the aqueous solution, it may also be considered a method of using dry etching or plasma processing but such method gives damages to the silicon substrate in the domain 1. Accordingly, a method of previously forming the silicon dioxide 31 in the domain 1 by chemical vapor deposition and then dissolving and removing the same as described for the embodiment of the present invention is optimal.

The thickness of the silicon dioxide 34 formed in the domain 1 can be controlled depending on the dry oxidation condition for forming the same. However, as the thickness of the silicon dioxide 34 formed on the domain 1 increases, that is, as the dry oxidation is conducted under the condition of higher temperature or longer time, introduction of oxygen into the oxygen-containing silicon nitride film 32 in the domain 2 is proceeded to increase the thickness. Further, the composition of the oxygen-containing silicon nitride film 32 approaches to that of silicon oxide and its advantage that the leak current is lower compared with the oxide film is lost.

Naturally, the thickness can be controlled to some extent by making the conditions for the heat treatment to shorter time or lower temperature in the $N_2O$ atmosphere in the preceding step while considering the conditions for dry oxidation. However, as a result of study of the inventors, when the thickness of the silicon dioxide 34 formed in the domain 1 exceeds 6 nm, the thickness of the oxygen-containing silicon nitride film formed on the domain 2 increases remarkably, which is not practical. Further, it is of course possible to form the silicon dioxide 34 on the domain 1 by the method other than dry oxidation and, for example, wet oxidation may also be used. However, in this case, oxygen is introduced more abruptly to the silicon nitride film compared with the case of dry oxidation and the equivalent oxide thickness of the oxygen-containing silicon nitride film 32 formed on the domain 2 is increased more.

Further, in the completed state, it is also possible to form, in the domain 1, a nitrogen-containing silicon oxide film instead of the silicon dioxide containing no substantial nitrogen, in which after the formation of the silicon dioxide in the domain 1, a heat treatment may be applied in the atmosphere containing NO or $N_2O$ for instance. However, feature of this embodiment compared with Embodiment 1 of the invention described previously is that a silicon dioxide not substantially containing nitrogen can be formed. For forming the oxygen-introduced silicon nitride film and the nitrogen-containing silicon oxide film on one identical silicon substrate, the method described for Embodiment 1 of the invention is more suitable and, in addition, the thickness of the silicon dioxide formed on the domain 1 can be made 6 nm or more.

An n-channel MOS transistor having two types of different gate dielectrics on one identical silicon substrate was manufactured by the combination of the procedures for forming different dielectric films in the domain 1 and 2 and the method of manufacturing the n-channel MOS transistor like that described for Embodiment 1 of the invention.

The silicon dioxide was formed on the domain 1 by dry oxidation to film thickness of 2.5 nm. The equivalent oxide thickness of the gate dielectric determined by measurement for the electrical capacitance was 2.5 nm for the domain 1 and 1.6 nm for the domain 2. Furthermore, the gate leak current of the MOS transistor in the domain 2 was suppressed to 1/10 compared with the MOS transistor having the silicon dioxide of 1.5 nm thickness as the gate dielectric.

When the transconductance was measured for the MOS transistor prepared in the domain 1 having a gate length of 1 $\mu$m under the bias condition at a drain voltage of 50 mV, the maximum value of the transconductance was increased by 12% compared with the MOS transistor prepared in the domain 1 in Embodiment 1 of the invention. Considering that the equivalent oxide film thickness is 2.5 nm for both of the gate dielectrics, it is considered that the maximum value of the electron mobility in the channel increases for the silicon dioxide not containing nitrogen prepared in the domain 1 according to Embodiment 2 of the invention than for the silicon dioxide containing nitrogen formed in the domain 1 according to Embodiment 1 of the invention. This is a desirable characteristic, for example, in analog devices.

As described above, it is possible to form two types of gate dielectrics, that is, an oxygen-containing silicon nitride film 32 of an equivalent oxide film thickness of 1.6 nm and having a gate leak current being restricted to ⅒ of the silicon dioxide and a good current drivability and providing extremely effective suppression for B diffusion and a silicon dioxide 22 of a thickness of 2.5 nm not substantially containing nitrogen on one identical wafer without giving damages and contaminations to the surface of the silicon substrate.

<Embodiment 3>

A method of manufacturing a semiconductor device of 3-thickness level comprising a gate dielectric formed of oxygen-containing silicon nitride., a gate dielectric formed of silicon oxide not substantially containing nitrogen and a gate dielectric formed of nitrogen-containing silicon oxide is to be described with reference to FIGS. 7A to 7G.

After forming isolation trenches 2 by using well-known shallow isolation trench on the surface of a silicon substrate 1, a silicon dioxide 41 of 10 nm thickness is formed on the silicon substrate 1 by wet oxidation at 850° C.

Figure 7A:
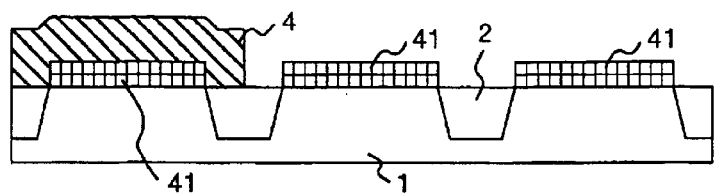
FIGS. 7A to 7G are cross sectional views for explaining a third embodiment of the invention.

Then, a resist 4 is coated on the entire surface of a wafer and usual patterning is conducted to remove a portion of the resist (FIG. 7A). In this process, a domain 1 is formed to a portion of the substrate 1 covered with the resist 4.

Figure 7B:

The silicon dioxide 41 other than the domain 1 is removed by a diluted HF solution and, successively, the resist 4 is dissolved and removed by an aqueous solution containing $H_2SO_4$ and an $H_2O_2$ (FIG. 7B). Subsequently, SC-1 cleaning and SC-2 cleaning are conducted to remove contaminations on the surface. Further, after conducting SC-1 cleaning and cleaning with diluted HF, a silicon dioxide 42 of 5 nm thickness is deposited by chemical vapor deposition using monosilane and $N_2O$ as a source gas.

Figure 7C:
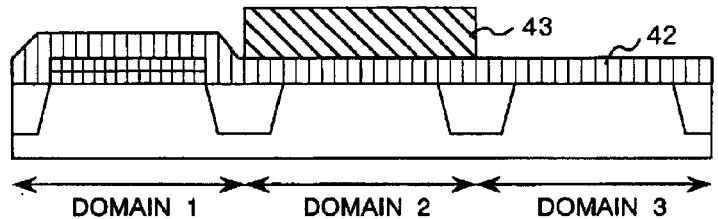

Successively, a resist 43 is coated over the entire surface, and usual patterning is applied to leave the resist 43 only in the portion of the domains other than the domain 1 (FIG. 7C). The region in which the resist 43 is left is a domain 2 and other domains than the domain 1 and 2 is a domain 3.

Figure 7D:
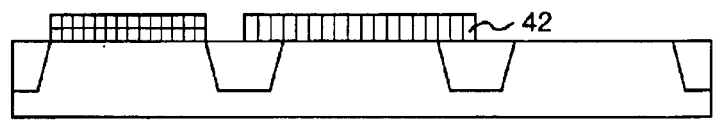

The silicon dioxide 42 in the domains 1 and 3 is dissolved and removed by a diluted HF solution and then the resist 43 is dissolved and removed by an aqueous solution containing $H_2SO_4$ and $H_2O_2$ (FIG. 7D). By the cleaning, the silicon dioxide 41 on the domain 1 is scraped to a film thickness of 9 nm. Then, SC-1 cleaning and SC-2 cleaning are conducted to remove contaminations on the surface.

Figure 7E:
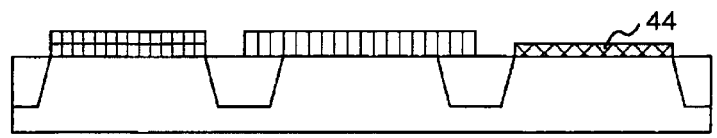

Further, after conducting SC-1 cleaning and cleaning with diluted HF, a silicon nitride film of 0.9 nm thickness is formed in the domain 3 by a heat treatment at 700° C. in $NH_3$ gas atmosphere and, successively, oxygen is introduced into the silicon nitride film by a heat treatment at 900° C. in an $N_2O$ atmosphere diluted to 5% with nitrogen thereby forming an oxygen-containing silicon nitride film 44 on the domain 3 (FIG. 7E). In this process, nitrogen is introduced to the silicon dioxide 41 on the domain 1. Further, nitrogen is introduced also into the silicon dioxide 42 on the domain 2.

Figure 7F:
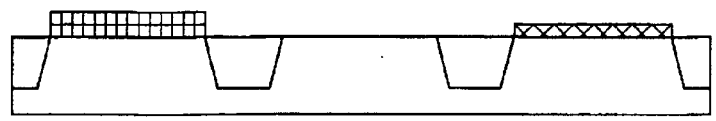

Successively, the silicon dioxide 42 on the domain 2 is dissolved and removed by a diluted HF solution. Since the silicon dioxide 42 on the domain 2 is a film formed originally by chemical vapor deposition, the dissolution rate thereof to the diluted HF solution is higher than that of the thermal oxide film. Accordingly, during dissolution and removal of the silicon dioxide 42 on the domain 2, the silicon dioxide 41 on the domain 1 is dissolved only to an extent of decreasing the thickness by about 3 nm and the film thickness is 6 nm. Further, for the oxygen-introduced silicon nitride film 44 in the domain 3, only the portion of the composition near the silicon oxide formed in the portion thereabove is dissolved and the portion of the composition near silicon nitride present to a portion therebelow is scarcely dissolved (FIG. 7F).

Figure 7G:
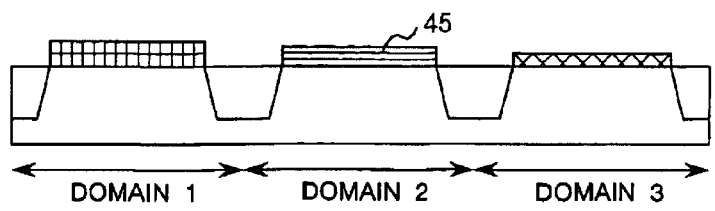
Figure 8A:
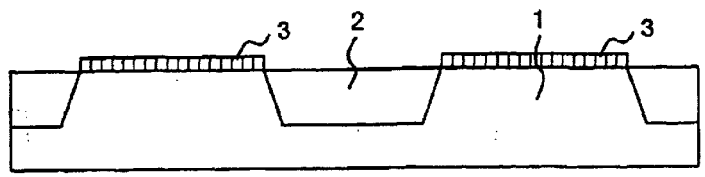
FIGS. 8A to 8F are cross sectional views for explaining an existent manufacturing method for a semiconductor device.
Figure 8B:
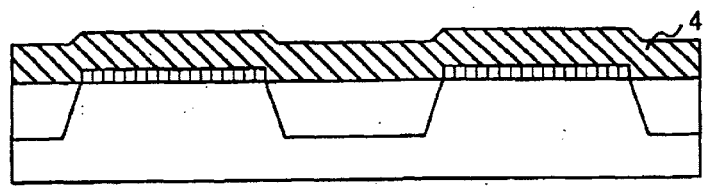
Figure 8C:
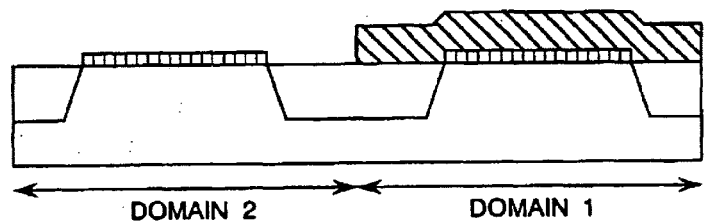
Figure 8D:
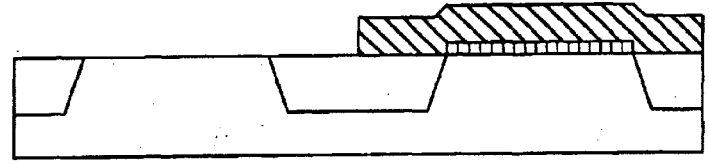
Figure 8E:
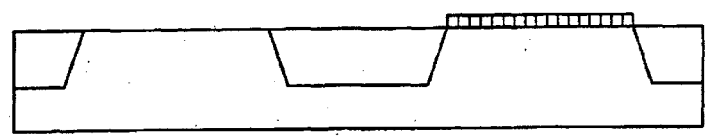
Figure 8F:
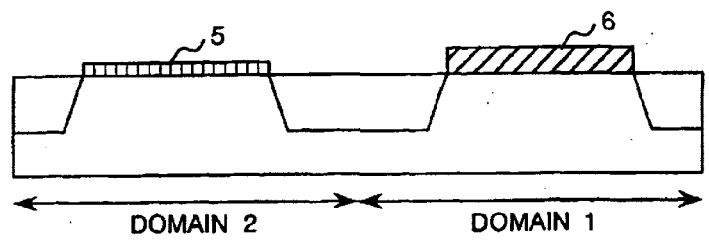
Figure 9A:
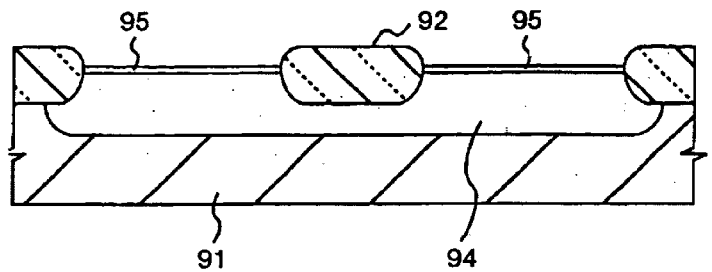
FIGS. 9A to 9C are cross sectional views for explaining another existent manufacturing method for a semiconductor device.
Figure 9B:
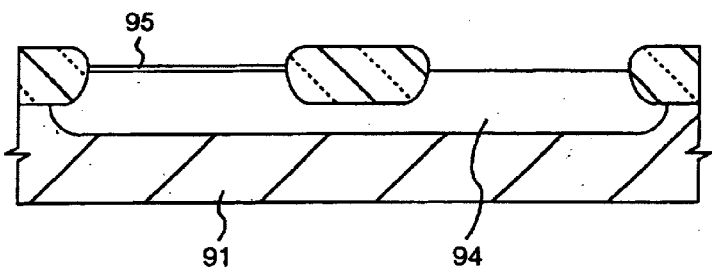
Figure 9C:
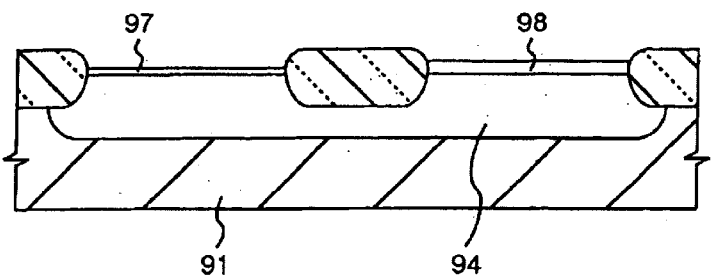

Then, a silicon dioxide 45 of 2.5 nm thickness is formed on the silicon substrate where the domain 2 is exposed by dry oxidation at 800° C. In the dry oxygen step, the thickness of the silicon dioxide 41 on the domain 1 increases from 6 nm to 7 nm. Simultaneously, oxygen is further introduced into the oxygen-containing silicon nitride film 44 on the domain 3, and a portion having a composition near the silicon oxide is formed again to a portion thereabove (FIG. 7G).

In this way, the nitrogen-containing silicon oxide film 41 of 7 nm thickness is formed on the domain 1, the silicon dioxide 45 of 2.5 nm thickness not substantially containing nitrogen is formed in the domain 2, and the oxygen-containing silicon nitride film 44 is formed in the domain 3, making it possible to form three types of gate dielectrics on one identical silicon substrate.

An n-channel MOS transistor having different three types of gate dielectrics was manufactured on one identical silicon substrate by combining procedures forming three types of gate dielectrics on one identical silicon substrate as described above and a method of forming the MOS transistor described in Embodiment 1 of the invention.

The equivalent oxide thickness for the gate dielectric determined based on the measurement for the electrical capacitance was 6.9 nm for the domain 1, 2.5 nm for the domain 2 and 1.6 nm for the domain 3. The transistors formed in the respective regions are directed to a device for input/output portion at a power source voltage of 3.3 V, a device for analog circuit portion and a device for high speed logic circuit portion operating at 0.8 to 1.4 V.

The characteristics of the gate dielectric 45 in the domain 2 were naturally equivalent with those of usual thermal oxide film of 2.5 nm thickness. Further, the characteristics of the oxygen-containing silicon nitride film 44 formed in the domain 3 were comparable with those of the oxygen-containing silicon nitride film formed in the domain 2 in Embodiment 2 of the invention. That is, the leak current was suppressed to about ⅒ compared with that of an existent thermal oxide film of 1.6 nm thickness.

By the way, for the nitrogen-containing silicon oxide film 41 formed on the domain 1, a silicon dioxide of 10 nm thickness is once formed, then the thickness is decreased to 6 nm by way of a dissolving treatment with a diluted HF solution and then dry oxidation is conducted again to form a silicon dioxide of 7 nm thickness. Such a dissolving treatment during formation of the dielectric film may sometimes give an effect on the dielectric break down life of the film but the dielectric break-down life is generally recovered by re-dry oxidation after the dissolving treatment.

In view of the above, for evaluating the dielectric breakdown life of the silicon dioxide 41 on the domain 1, the dielectric break-down life of the n-channel MOS transistor with a gate length of 15 μm and the gate width of the 15 μm prepared in the domain 1 was measured. The result for the life estimation assuming the use at 3.3 V is 10000 years or more and it has been found that there are no troubles at all.

In this way, it is possible to form three types of gate dielectrics including an oxygen-containing silicon nitride film 44 of an equivalent oxide thickness of 1.6 nm, a gate leak current restricted to ¹/₁₀ of a silicon dioxide, and having good current drivability and extremely effective suppression for B diffusion, a nitrogen-containing silicon oxide film 41 of an equivalent oxide film thickness of 6.9 nm, and a silicon dioxide 22 not substantially containing nitrogen of a thickness of 2.5 nm on one identical wafer with no damages or contaminations to the surface of the silicon substrate.

According to the present invention, it is possible to manufacture an MOS device comprising an oxygen-containing silicon nitride film of an equivalent oxide thickness of 2 nm or less, and having a gate leak current less than that of an existent silicon dioxide and showing high characteristics for the effect of suppressing B diffusion, and a silicon dioxide of a desired film thickness, respectively, as gate dielectrics on one identical silicon substrate. Particularly, for the silicon dioxide, it is possible to form a film not substantially containing nitrogen so long as the thickness is 6 nm or less. By using the gate dielectrics described above, plural types of MOS devices such as high speed MOS device, high voltage withstanding MOS device and MOS device for analog circuits can be present together in one identical chip while attaining high performances thereof respectively.

It is further understood by those skilled in the art that the foregoing description is preferred embodiments of the disclosed device and that various changes and modifications may be made in the invention without departing from the spirit and scope thereof.

What is claimed is:

1. A method for manufacturing a semiconductor device comprising the steps of:

forming a first semiconductor domain and a second semiconductor domain isolated from each other by forming a field dielectric layer for device isolation selectively on a surface of a silicon semiconductor substrate;

forming a silicon dioxide film on each of surfaces of the first semiconductor domain and the second semiconductor domain;

removing the silicon dioxide formed on the surface of the second semiconductor domain for exposing the surface of the second semiconductor domain;

forming a nitrogen-containing silicon oxide film on the surface of the first semiconductor domain and forming a silicon nitride film on the surface of the second semiconductor domain by nitriding the silicon dioxide in the first semiconductor domain, and the exposed surface of the second semiconductor domain;

forming an oxygen-containing silicon nitride film on the surface of the second semiconductor domain by oxidizing the silicon nitride film; and forming a gate electrode on each of the nitrogen-containing silicon oxide film and the oxygen-containing silicon nitride film;

wherein the thickness of the silicon nitride film before the oxidation in the step of forming the oxygen-containing silicon nitride film is 1.5 nm or less, and an equivalent oxide thickness (EOT) of the oxygen-containing silicon nitride film is 2.5 nm or less.

2. The method for manufacturing a semiconductor device according to claim 1, wherein the nitridation in the step of forming the nitrogen-containing silicon oxide film in the first semiconductor domain and forming the silicon nitride film in the second semiconductor domain is a heat treatment in an $NH_3$-containing atmosphere.

3. The method for manufacturing a semiconductor device according to claim 1, wherein the nitridation in the step of forming the nitrogen-containing silicon oxide film in the first semiconductor domain and forming the silicon nitride film in the second semiconductor domain is a treatment using nitrogen radicals.

4. The method for manufacturing a semiconductor device according to claim 1, wherein the oxidation in the step of forming the oxygen-containing silicon nitride film is a heat treatment in an $N_2O$-containing atmosphere.

5. The method for manufacturing a semiconductor device according claim 1, wherein the oxygen concentration of the oxygen-containing silicon nitride film formed in the second semiconductor domain is at a minimum in an intermediate portion of the film between the boundary of the silicon nitride film and the silicon semiconductor substrate, and the surface of the silicon nitride film.

* * * * *